(12) United States Patent
Harding

(10) Patent No.: US 8,707,948 B2
(45) Date of Patent: Apr. 29, 2014

(54) NON-TRACKING SOLAR COLLECTOR DEVICE

(75) Inventor: Geoffrey Lester Harding, Chatswood (AU)

(73) Assignee: Kloben S.A.S. di Turco Adelino EC., Verona (IT)

( * ) Notice: Subject to any disclaimer, the term of this patent is extended or adjusted under 35 U.S.C. 154(b) by 520 days.

(21) Appl. No.: 13/119,767

(22) PCT Filed: Aug. 5, 2009

(86) PCT No.: PCT/IB2009/006455
§ 371 (c)(1),
(2), (4) Date: May 9, 2011

(87) PCT Pub. No.: WO2010/032095
PCT Pub. Date: Mar. 25, 2010

(65) Prior Publication Data
US 2011/0203574 A1 Aug. 25, 2011

(30) Foreign Application Priority Data

Sep. 18, 2008 (AU) .................................. 2008904860

(51) Int. Cl.
*F24J 2/54* (2006.01)
*F24J 2/40* (2006.01)
*F24J 2/10* (2006.01)
*F24J 2/04* (2006.01)

(52) U.S. Cl.
USPC ........... 126/595; 126/589; 126/599; 126/627; 126/696; 126/705; 359/855; 359/865; 359/873

(58) Field of Classification Search
USPC ....................................................... 126/595
See application file for complete search history.

(56) References Cited

U.S. PATENT DOCUMENTS

| 2,473,329 A | * | 6/1949 | Candler | 415/160 |
| 2,597,539 A | * | 5/1952 | Smart | 52/204.51 |
| 2,736,514 A | * | 2/1956 | Ross | 244/15 |
| 2,909,171 A | | 10/1959 | Löf | |

(Continued)

FOREIGN PATENT DOCUMENTS

| DE | 20200200 U1 * | 1/2002 |
| EP | WO2008000282 A1 * | 1/2008 |

(Continued)

OTHER PUBLICATIONS

Search Report mailed May 7, 2010 in International Patent Application No. PCT/IB2009/006455.

*Primary Examiner* — Kang Hu
*Assistant Examiner* — Martha Becton
(74) *Attorney, Agent, or Firm* — Stein IP, LLC

(57) ABSTRACT

Non-tracking solar collector device (1) comprising at least an absorber element (2), at least a couple of reflector elements (3) disposed on opposite sides of the absorber element (2) for conveying the solar radiation onto the absorber element itself and said reflector elements (3) comprising at least one fixed portion (8a,8b) and at least one rotating portion (9); the rotating portions (9) being movable between at least a first extreme position (10), in which the rotating portions are moved away from each other and the entire surface of said reflector elements (3) is substantially continuous, and a second extreme position (11), in which the rotating portions are moved close to each other in order to substantially obscure said absorber element (2).

16 Claims, 2 Drawing Sheets

(56) References Cited

U.S. PATENT DOCUMENTS

| | | | | |
|---|---|---|---|---|
| 2,969,918 A * | 1/1961 | Phelps | | 126/595 |
| 2,998,002 A | 8/1961 | Standig | | |
| 3,162,189 A * | 12/1964 | Small et al. | | 126/579 |
| 3,286,259 A * | 11/1966 | Carman et al. | | 342/10 |
| 4,026,269 A * | 5/1977 | Stelzer | | 126/702 |
| 4,109,638 A * | 8/1978 | Matlock et al. | | 126/605 |
| 4,175,391 A * | 11/1979 | Baer | | 60/531 |
| 4,196,721 A * | 4/1980 | Posnansky | | 126/680 |
| 4,210,463 A * | 7/1980 | Escher | | 136/246 |
| 4,222,368 A * | 9/1980 | Rost et al. | | 126/600 |
| 4,239,033 A * | 12/1980 | Matkovits | | 126/655 |
| 4,281,637 A * | 8/1981 | Wilson | | 126/586 |
| 4,281,644 A | 8/1981 | Chiles | | |
| 4,304,218 A * | 12/1981 | Karlsson | | 126/607 |
| 4,425,904 A * | 1/1984 | Butler | | 126/606 |
| 4,442,828 A * | 4/1984 | Takeuchi et al. | | 126/681 |
| 4,461,277 A * | 7/1984 | Pardo | | 126/573 |
| 4,475,536 A * | 10/1984 | Dame | | 126/585 |
| 4,505,263 A * | 3/1985 | Nameda et al. | | 126/605 |
| 4,545,366 A * | 10/1985 | O'Neill | | 126/698 |
| 4,602,613 A * | 7/1986 | Barr | | 126/600 |
| 4,632,091 A * | 12/1986 | Wiens | | 126/578 |
| 5,325,844 A * | 7/1994 | Rogers et al. | | 126/605 |
| 6,363,928 B1 * | 4/2002 | Anderson, Jr. | | 126/577 |
| 6,498,290 B1 * | 12/2002 | Lawheed | | 136/246 |
| 6,637,428 B2 | 10/2003 | Winston | | |
| 7,055,519 B2 * | 6/2006 | Litwin | | 126/683 |
| 7,192,146 B2 * | 3/2007 | Gross et al. | | 359/853 |
| 2004/0187862 A1 * | 9/2004 | Cobos, Jr. | | 126/657 |
| 2006/0157050 A1 * | 7/2006 | Le Lievre | | 126/696 |
| 2007/0199563 A1 * | 8/2007 | Fox | | 126/684 |
| 2008/0083405 A1 * | 4/2008 | Kimura et al. | | 126/690 |

FOREIGN PATENT DOCUMENTS

| | | |
|---|---|---|
| JP | 2002-22286 | 1/2002 |
| WO | WO 03/098125 | 11/2003 |
| WO | WO 2008/000282 | 1/2008 |

\* cited by examiner

NON-TRACKING SOLAR COLLECTOR DEVICE

CROSS-REFERENCE TO RELATED APPLICATIONS

This application claims the benefit of PCT International Patent Application No. PCT/IB2009/006455, filed Aug. 5, 2009, and Australian Patent Application No. 2008904860, filed Sep. 18, 2008, in the Australian Patent Office, the disclosures of which are incorporated herein by reference.

BACKGROUND OF THE INVENTION

1. Field of the Invention

The present invention relates to a non-tracking solar collector device.

2. Description of the Related Art

Solar radiation collection devices incorporating reflector elements for focusing incident radiation onto an absorber element are well known. The reflector elements may consist of a large aperture elongated parabolic trough which moves to track the sun and thereby maintain the focusing of sunlight onto an absorber element. In the case where smaller aperture reflector troughs are used, a non-tracking stationary reflector may be used. Such reflectors are usually of the parabolic concentrator or compound parabolic concentrator (CPC) type.

The known non-tracking solar collector devices generally comprise a couple of reflector elements disposed on opposite sides of the absorber element.

The absorber element may constitute an elongated tube or a metal plate with attached metal tubes through which a heat transfer fluid is pumped for heat extraction. Alternatively an array of solar photovoltaic cells disposed on an elongated metal strip may be used for electricity production. To prevent overheating of the photovoltaic cells, the metal strip will generally have attached metal tubing through which a coolant fluid is pumped.

In the event that the absorber element may overheat, for example due to malfunction of the collector system resulting in the interruption of flow of the heat transfer fluid or coolant fluid, or when the fluid flow is temporarily interrupted for maintenance purposes, the reflector in a tracking system may be moved to a position which prevents solar radiation being focused onto the absorber element. In the case of non-tracking reflectors the absorber element is continuously illuminated by solar radiation, thus there is need for a simple mechanism to protect the absorber element from overheating.

Solar radiation collector devices incorporating non-tracking reflector troughs are usually arranged side-by-side to form a collector panel.

U.S. Pat. No. 3,162,189 describes a solar radiation collection device incorporating a parabolic dish reflector with a small boiler at the focus. Small blades interposed between boiler and reflector dish may be oriented to have minimal interference with light reflected from the parabolic dish toward the boiler, or by rotation of the blades through 90°, effectively interrupt the light reflected from the parabolic dish. The amount of energy incident on the boiler is determined by the orientation of the blades which is controlled by a thermometer attached to the boiler. The thermometer is of the enclosed liquid type and uses expansion of the liquid and vapor to expand a bellows which drives the rotation of the blades.

The rotating blade design is difficult to implement for a parabolic or compound parabolic trough reflector due to the elongated reflector and absorber element, the close proximity of the absorber element to the reflector surface in most non-tracking collector designs, and the wide range of directions for radiation incident on the absorber element after reflection from a trough reflector.

U.S. Pat. No. 4,475,536 describes a combined solar heat collector—skylight in which a plurality of reflector elements is translated by a short distance between a position which accomplishes heating of fixed absorber elements which are necessarily disposed below the reflector elements, and a position where the reflector elements channel light into the interior of the building, and also to intermediate positions where a combination of heating of absorber elements and illumination of the building interior can be obtained. Means for translation of the reflectors involves an electric motor controlled by a sensor which measures absorber temperature, and light intensity sensors in the interior of the building.

This translation mechanism is not specifically designed to prevent overheating of the absorber elements. Indeed this translation mechanism, involving translation of the entire reflector system, is very complex and in the case of large and elongated reflector elements does not quickly and efficiently control the sunlight intensity incident on the absorber element. Moreover, this translation mechanism is not suitable when the fixed absorber element is disposed between the reflector elements because translation of the reflector will be obstructed by the absorber element. Moreover, this translation mechanism requests a relatively large amount of applied force and energy for translating the reflector elements.

A number of U.S. patents describe solar heat collectors incorporating reflector elements disposed on opposite sides of the absorber element and substantially the entire area of reflector element is pivoted in order to be manually collapsed or folded like a "clam shell" to enclose the absorber element.

U.S. Pat. No. 4,304,218 describes a plurality of elongated solar collectors incorporating compound parabolic reflectors arranged side-by-side within a double glazed window frame. Each solar collector consists of two reflector elements which may be rotated manually from an open reflector position to a closed non-reflector position entirely enclosing the tubular absorber element positioned between the reflector elements themselves. The rotational facility is designed to form a structure resembling a Venetian blind, allowing sunlight into a room interior when the reflector elements are closed.

U.S. Pat. No. 6,363,928 describes a tracking trough collector in which the two reflector elements, after manual removal of a support structure, can be manually collapsed to encase the absorber element to protect the absorber and reflector from adverse weather conditions.

U.S. Pat. Nos. 2,909,171, 2,998,002, 4,196,721, 4,281,644, 4,442,828 and 6,637,428 are examples of small portable collectors with manual folding facility for the reflector elements for ease of transport or to protect the reflector and absorber element from damage when not in use.

None of the collectors with rotatable reflector elements are designed specifically to avoid overheating of the absorber element and require manual intervention to enclose the absorber element. Moreover, the known collector devices utilize rotation of substantially the entire area of reflector elements, that results in a complex drive mechanism and that is non-efficient in avoiding overheating of the absorber element.

More particularly, in the case of non-portable collectors it is not possible to incorporate in an efficient way a drive mechanism for reflector elements having a large and elongated shape due to the relatively large force and energy required to quickly move the entire area of reflector elements that have considerable length and weight.

The document WO 2008/000282 discloses a protective device for a solar panel connector, comprising at least one transparent wall, at least one protective element for covering and protecting the transparent wall, and means for automatically moving the protective element between a first operative position, in which the protective element does not interfere with the transparent wall, and a second operative position, in which the protective element is positioned over, and covers the transparent wall protecting it from bad meteorological conditions and damages.

This device however is also susceptible of improvements.

So, the structure of the non-tracking solar collector devices already known and the conformation of their reflector elements doesn't efficiently prevent overheating of the absorber element disposed between the reflector elements themselves.

SUMMARY OF THE INVENTION

The aim of the present invention is to provide a non-tracking solar collector device that prevents overheating of the absorber element more efficiently in respect of the known devices, particularly in the case of reflector elements having a considerable length and weight.

Within this aim, another object of the present invention is to provide a non-tracking solar collector device that requires a relatively small applied force and energy to obscure quickly the absorber element so as to prevent its overheating.

Another object of the present invention is to efficiently convey the sunlight onto the absorber element during the various stages of the day, in order to maximize the amount of energy captured.

Within the scope of such technical aim, another object of the present invention is to cater for the above aims with a simple structure, of relatively practical implementation, safe to use and with effective operation, as well as having a relative low cost.

This aim and these and other objects are all achieved by the present non-tracking solar collector device comprising:
  at least an absorber element;
  at least a couple of reflector elements disposed on opposite sides of said absorber element for conveying the solar radiation onto the absorber element itself;
  characterized in that each one of said reflector elements comprises at least one fixed portion and at least one rotating portion, the rotating portions being movable between at least a first extreme position, in which the rotating portions are moved away from each other and the entire surfaces of said reflector elements are substantially continuous, and a second extreme position, in which the rotating portions are close to each other in order to substantially obscure said absorber element from incident sunlight.

BRIEF DESCRIPTION OF THE DRAWINGS

Further characteristics and advantages of the present invention will appear even more evident from the detailed description of a preferred, but non-exclusive, embodiment of a non-tracking solar collector device, illustrated indicatively by way of a non limiting example, in the attached drawings wherein.

DETAILED DESCRIPTION OF THE EMBODIMENTS

With particular reference to such figures, globally indicated by 1 is a non-tracking solar collector device.

The device 1 comprises at least an absorber element 2 and at least a couple of reflector elements 3 disposed on opposite sides of the absorber element 2 for conveying the solar radiation onto the absorber element itself.

Figure 1:
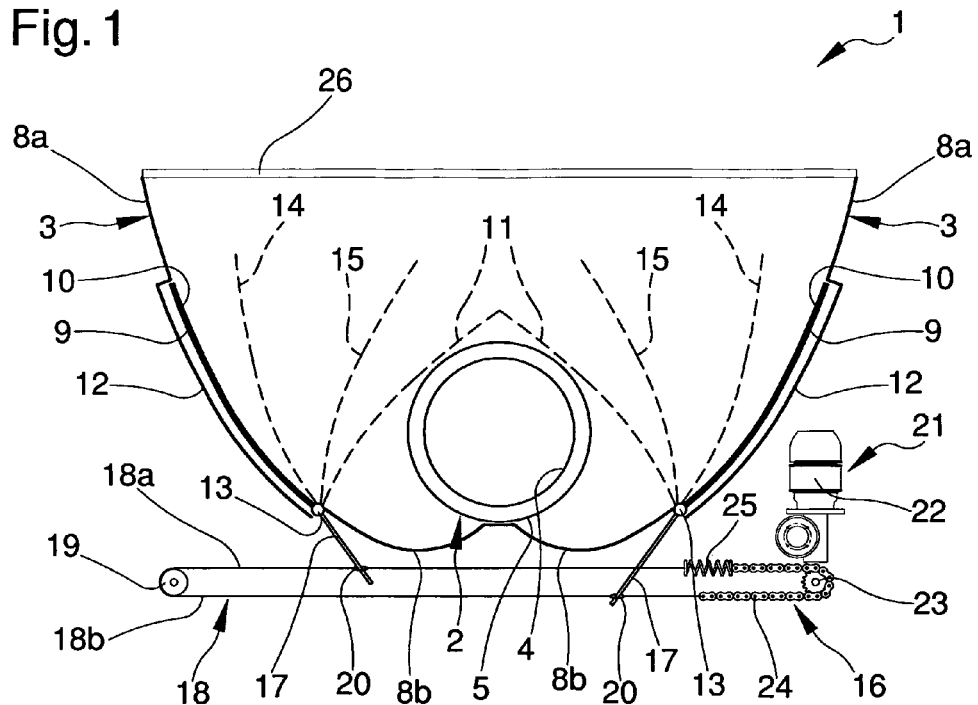
FIG. 1 is a cross sectional view of a symmetric non-tracking solar collector device according to the invention.

In the example represented in FIG. 1, the absorber element 2 is an example of a tubular absorber of the evacuated glass tubular collector type for heat production and comprises an elongated absorber tube 4 with glass envelope 5 which extends longitudinally along the entire length of the device 1.

Figure 2:
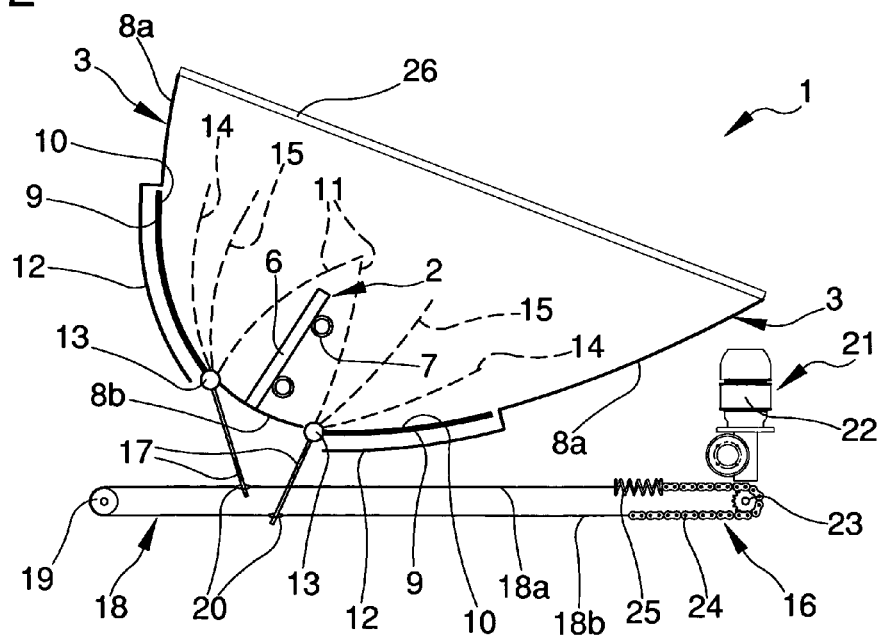
FIG. 2 is a cross sectional view of an asymmetric non-tracking solar collector device according to the invention.

In the example of FIG. 2, the absorber element 2 is constituted by a metal plate 6 with attached metal tubes 7 for heat production.

In other embodiments (not shown), the absorber element 2 may be constituted by an array of solar photovoltaic cells disposed on an elongated metal strip for electricity production or by a metal plate with attached metal tubes enclosed within an evacuated glass tubular envelope for heat production.

The reflector elements 3 may be symmetrically disposed in respect of the absorber element 2, as represented in the embodiment of FIG. 1, or may be asymmetrically disposed in respect of the absorber element 2, as represented in the embodiment of FIG. 2.

In the present disclosure, the same parts described in each embodiment carry the same reference numerals.

The reflector elements 3 are formed in the profile shape of a compound parabolic reflector or in other profile shapes, for example including linear sections or a combination of parabolic and linear sections.

The position of the absorber element 2 and the profile shape of the reflector elements 3 are designed to maximize the collection of sunlight over the widest range of incident angles for sunlight, however the reflector element design may also be configured to improve the uniformity of the sunlight distribution over the absorber element 2.

According to the present invention, each one of the reflector elements 3 comprises at least one fixed portion 8a,8b and at least one rotating portion 9.

The rotating portions 9 are movable between at least a first extreme position, in which they are moved away from each other and the entire surfaces (the inner surfaces) of the reflector elements 3 are substantially continuous, and a second extreme position, in which they are moved close to each other in order to substantially obscure the absorber element 2.

In the attached figures, the first and the second extreme position are represented, respectively, with the continuous lines 10 and the dotted line 11.

The length of the rotating portions 9 is as such to completely cover the absorber element 2 in the second extreme position.

Preferably, the reflector elements 3 surfaces may be supported on, for example, suitably shaped rigid metal, polymer or fiberglass sheet (not shown).

Advantageously, the rear surface of each rotating portion 9 is coated with a solar radiation reflecting element such as white paint, to minimize absorption of solar radiation by the rotating portions themselves when rotated to various positions and some solar radiation is incident on their rear surfaces. Minimal absorption will reduce the possibility of overheating and distortion of the rotating portions 9.

Moreover, behind each rotating portion 9, a cover sheet 12 is fixed to the corresponding fixed portion 8a and 8b to prevent ingress of dust or debris to the interior of the device 1 when the rotating portions 9 are in rotated positions.

Preferably, the cover sheets 12 are made of thin metal, polymer or fiberglass sheet.

Advantageously, the rotating portions 9 are able to rotate around a relative fixed pivot 13.

Moreover, the rotating portions 9 are attached to elongated shafts, not shown in the alleged figures, supported at each pivot position by bearings in the collector framework (not shown). The elongated shafts at each pivot position are disposed below the corresponding reflector element surface so as not to interfere with the reflection of solar radiation.

More particularly, the fixed pivots 13 are situated at or close to the extremities of the rotating portions 9 nearest to the absorber element 2.

Preferably, each one of the reflector elements 3 comprises at least a first and a second fixed portions, respectively 8a and 8b, disposed at opposite ends of the corresponding rotating portion 9.

The upper part of the first fixed portions 8a and the lower part of the second fixed portions 8b are fixed relative to the absorber element 2 by means of a rigid framework (not shown).

The second fixed portions 8b are disposed in correspondence to the absorber element 2 and each fixed pivot 13 is disposed close to the corresponding second fixed portion 8b. More particularly, the second fixed portions 8b are disposed at least partially below the absorber element 2.

The second fixed portions 8b of the device 1 may be rigidly connected to each other, as represented in the FIGS. 1 and 2, forming a single continuous second fixed portion.

Advantageously, the rotating portions 9 are also movable to at least a first intermediate position where the efficiency of sunlight collection is increased for light incidence at high angles of incidence. The first intermediate position is indicated in the attached figures with the dotted line 14. Advantageously, during the course of a day during some seasons of the year, two or even three slightly different intermediate positions 14 may be used to improve the efficiency of sunlight collection.

Moreover, the rotating portions 9 are also movable to at least a second intermediate position where the absorber element 2 is partially obscured from solar radiation. The second intermediate position is indicated in the attached figures with the dotted line 15. Advantageously a range of positions 15 may be used depending on the degree of obscuration required.

The device 1 comprises driving means 16 for control of the rotation of the rotating portions 9.

In a preferred, but not exclusive, form of embodiment, the driving means 16 comprise a pulley cable 18 which passes around a pulley wheel 19, thus providing a first and a second cable, respectively 18a and 18b, movable linearly in opposite directions. The first cable 18a is connected to one of the rotating portions 9 and the second cable 18b is connected to the other one of the rotating portions 9.

Moreover, the device 1 comprise a connection arm 17 rigidly associated to each one of the rotating portions 9 and coupled with the corresponding cable 18a,18b. More particularly, the device 1 comprises a connection arm 17 rigidly associated to one of the rotating portions 9 and coupled with the first cable 18a and a further connection arm 17 rigidly associated to the other one of the rotating portions 9 and coupled with the second cable 18b.

The connection arms 17 are used to counterbalance the rotating portions 9 and thereby reduce the rotational torque and energy required for rotation and facilitate rotation of the rotating portions themselves.

The first cable 18a is coupled with one of the connection arms 17 and the second cable 18b is coupled with the other one of the connection arms 17 in order to simultaneously rotate the rotating portions 9 in opposite directions.

The coupling between the cables 18a and 18b and the connection arms 17 can be achieved by small coupling rings 20 in the pulley cable 18 through which the connection arms 17, in the form of rod-like arms, pass. As the pulley cable 18 translates, the connection arms 17 slide freely through the rings 20 as the connection arms themselves rotate about the pivots 13. Although in FIG. 1 the connection arms 17 are shown, for reasons of clarity, to have slightly different lengths, the lengths of the two connection arms 17 would ideally be the same to produce the same magnitude of rotation for each rotating portion 9.

In the case of an asymmetric device, as that shown in FIG. 2, a different magnitude for the angular rotation for each of the rotating portions 9 can be produced by using different lengths of the connection arms 17.

It may readily be seen that a shorter length of the connection arm 17, as measured between pivot 13 and coupling ring 20, will result in a larger angle of rotation when the pulley cable is translated.

In an alternative solution, not represented in the attached figures, the above mentioned elongated shafts, connected to the rotating portions 9, are coupled with a relative sprocket wheel driven by a chain attached to the corresponding cable 18a,18b. More particularly, the device 1 comprises a first sprocket wheel directly connected with one of the elongated shafts and driven by a first short lengths of a chain attached to the first cable 18a and comprises a second sprocket wheel directly connected with the other one of the elongated shafts and driven by a second short lengths of a chain attached to the second cable 18b. The use of sprocket wheels of different diameters can accomplish different angular rotations in the case of the asymmetric device 1. In this alternative solution, the connection arms 17 are not present because the rotating portions 9 are directly moved by the elongated shafts, which are driven by the sprocket wheels.

Preferably, the driving means 16, and more particularly the pulley cable 18, are connected with motorized means 21.

More particularly, as represented in the preferred but non exclusive form of embodiment represented in the figures, the pulley cable 18 may be translated in either direction for example, by means of an electric motor 22 with attached a sprocket wheel 23 driving a short length of a chain 24 attached to the pulley cable 18 to form a continuous loop. The chain 24 and the pulley cable 18 may be joined by a spring 25 to maintain tension in the cable 18.

Alternatively, the pulley cable 18 may be translated by a rack attached to the pulley cable itself and a pinion secured to an electric motor, or by an electric motor driven linear actuator.

In the case where intermediate positions of the rotatable reflector sections are not utilized, the pulley cable 18 may be translated between the two extreme positions by means of a solenoid driven linear actuator or by a thermally driven mechanical device incorporating an expanding bellows.

Advantageously, the driving means 16 are controlled by a control circuit.

More particularly, the control circuit is connected with at least a temperature sensor associated with the absorber element 2, in order to energize the motorized means 21 for determining the linear translation of the first and second cable 18a and 18b in function of the absorber element 2 temperature.

Alternatively or in addition to the temperature sensor above described, in the case in which the absorber element 2 contains means for fluid circulation, the control circuit can be connected with at least a flow rate sensor for the flow rate of fluid through the absorber element 2, in order to energize the motorized means 21 for determining the linear translation of the first and second cable 18a and 18b in function of the flow rate of the fluid inside the absorber element itself.

In a further embodiment, the control circuit is manually controlled to energize the motorized means.

Advantageously, the control circuit is designed to rotate the rotating portions 9 to predetermined positions at certain times in order to increase the efficiency for solar radiation collection when solar radiation is incident at high angles of incidence.

The control circuit could also be used to simultaneously activate an alarm to alert service personnel to a possible fault in the collector system such as overheating of the absorber element or cessation of heat transfer fluid flow. The control circuit should also allow the rotation of the rotating portions 9 to be activated by manual intervention.

Preferably, the device 1 comprises a cover element 26, such as low-iron glass, connected to the first fixed portions 8a of the reflector elements 3 in correspondence to their upper ends, in order to protect the absorber element 2 and the reflector surface 3 from rain, dust and debris.

Advantageously, the surfaces of the cover element 26 are anti-reflected to maximize transmission of solar radiation towards the absorber element 2. Furthermore the under surface of the cover element may be fitted with attached electric heater elements, not represented in the figures, in the form of fine wires to facilitate removal of ice or snow which accumulates on the cover element.

In the case where a cover glass is utilized, the size or extent of the rotating portions 9 and the position of the pivots 13 must be such that the rotating portions 9 when rotated do not make contact with the underside of the cover element 26.

The present invention relates also to a non-tracking collector panel 27 comprising a plurality of non-tracking solar collector device 1 arranged side by side in close proximity to each other.

Figure 3:
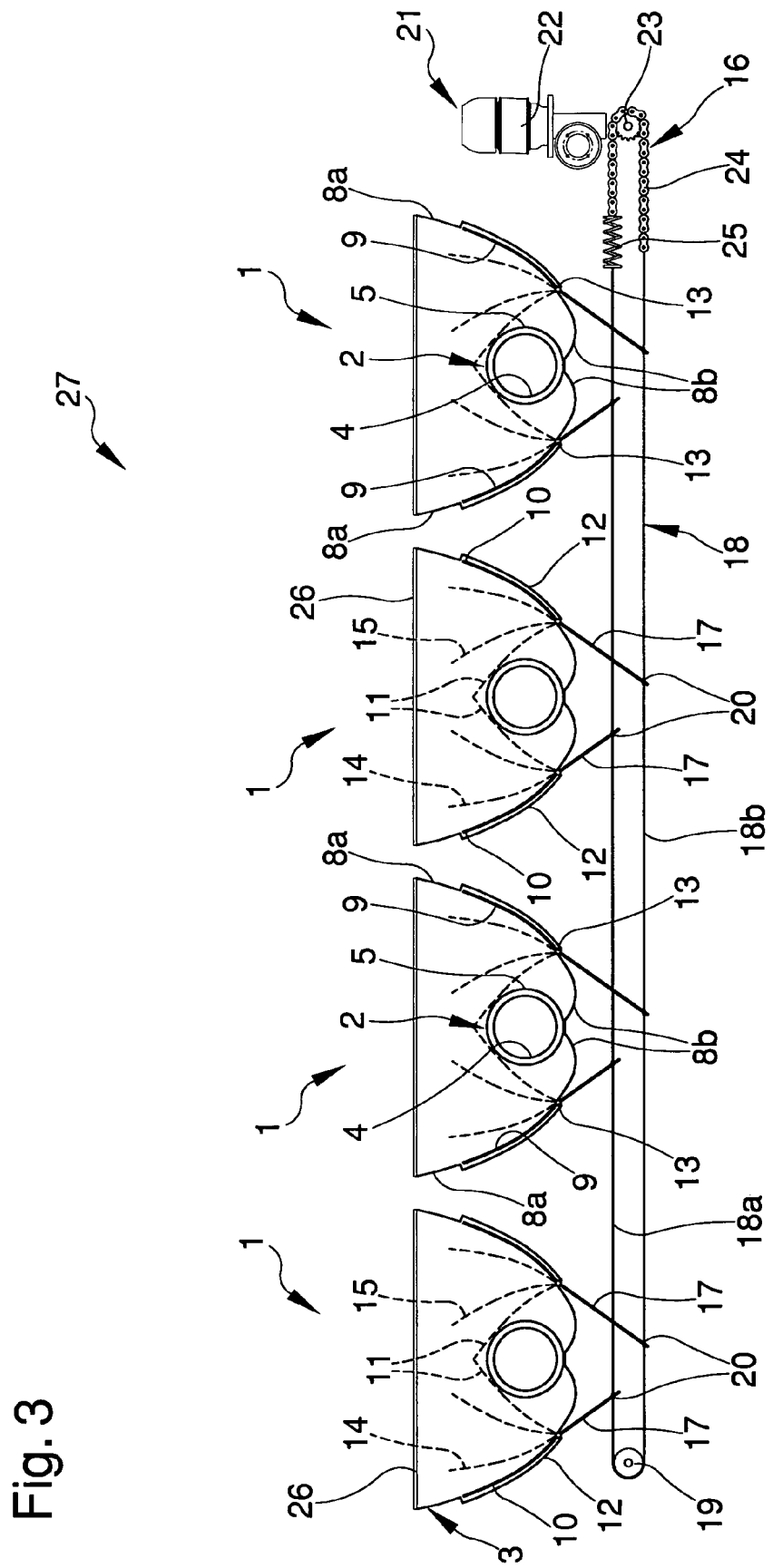
FIG. 3 is a cross sectional view of a plurality of symmetric solar collector devices arranged side by side to form a solar collector panel according to the present invention.

FIG. 3 illustrates an example of a panel 27 constituted by a plurality of symmetric collector device 1 disposed side by side.

Using a simple extension of the driving means 16 described above, the rotating portions 9 in each device 1 are simultaneously rotated by means of coupling to the pulley cable 18 which extends the entire width of the collector panel 27 and which passes around the pulley wheel 19 at one extremity of the collector panel 27. Individual cover elements 26 may be used on each solar collector device, or advantageously a single cover element may be used to cover all the solar collector devices arranged side by side in a collector panel.

Similarly a plurality of asymmetric collector device 1, as that represented in FIG. 2, may be disposed to form a collector panel 1, but it may be advantageous to space the individual collector devices 1 a short distance apart.

The invention thus conceived is susceptible of numerous modifications and variations, all of which are within the scope of the appended claims. Consequently, the claims should be liberally construed in a manner consistent with the scope of the invention, and should not be limited to their literal terms.

The invention claimed is:

1. A non-tracking solar collector device comprising:
at least an absorber element;
at least two reflector elements disposed on opposite sides of said absorber element for reflecting the solar radiation onto the absorber element itself,
  wherein each one of said reflector elements comprises at least one rotating element wherein each rotating element comprises a bottom end and a top end, each rotating element is able to pivot around a relative fixed pivot located at or near the bottom end of said rotating element, the rotating portions being movable about the fixed pivot locations during operation of the device between at least a first extreme position, in which each of the rotating elements of opposing reflector elements are moved away from each other to lay against a fixed element forming a seating surface of each opposing reflector element, and a second extreme position, in which the rotating elements of opposing reflector elements are rotated about the fixed pivot point to bring the far ends of opposing rotating elements towards each other in order to substantially obscure said absorber element,
  wherein each of said rotating elements are movable to at least a first intermediate position where the efficiency of sunlight is increased for light incidence at high angles of incidence and,
  wherein each of said rotating elements are movable to at least a second intermediate position where the absorber elements is partially obscured from solar radiation and,
  wherein each one of said reflector elements comprises said fixed element such that when a corresponding rotating element is in the first extreme position, the rotating element lays against the fixed element such that a lower portion of the fixed element extends below the bottom end of said rotating element and an upper portion extends beyond the top end of said rotating element to effectively form a continuous reflector element surface and;
a means for control of rotation of the rotating portions about the fixed pivot points that comprises a motorized means for rotation and a control circuit connected with at least a temperature sensor associated with the absorber element to determine an amount of rotating necessary by the motorized means to prevent overheating of said absorber element.

2. The device according to claim 1 wherein each one of said fixed pivot locations is disposed close to the corresponding lower portion of said fixed element.

3. The device according to claim 1, wherein the length of said rotating elements is as such to completely cover the absorber element in said second extreme position.

4. The device according to claim 1, wherein it comprises driving means for control of the rotation of said rotating elements.

5. The device according to claim 4, wherein said driving means comprises a pulley cable which comprises a first and a second portion movable linearly in opposite directions, the first portion being connected with at least one of the rotating elements and the second portion being connected with at least one of the rotating elements of an opposing reflector element.

6. The device according to claim 5 wherein it comprises a connection arm rigidly associated to each one of said rotating elements and coupled with respective cable portion.

7. The device according to claim 5 in that wherein it comprises an elongated shaft connected to each one of said rotating elements and coupled with a relative sprocket wheel driven by a chain attached to the pulley cable.

8. The device according to claim 4, wherein said driving means are connected with motorized means controlled by a control circuit.

9. The device according to claim 8 wherein said absorber element contains means for fluid circulation and in that said control circuit is connected with at least a flow rate sensor for the flow rate of fluid through the absorber element itself, in order to control the energization of the motorized means and determine the linear translation of said first and second cable portion in function of the flow rate of the fluid inside the absorber element.

10. The device according to claim 8 wherein said control circuit is manually controlled to energize said motorized means.

11. The device according to claim 8, wherein said control circuit is designed to rotate said rotating elements to predetermined positions at certain times to increase the efficiency for solar radiation collection when solar radiation is incident at high angles of incidence.

12. The device according to claim 1, wherein the rotating elements have a rear surface that is coated by a solar radiation reflecting element.

13. The device according to claim 1, wherein it comprises a cover element connected to the fixed elements of said reflector elements in correspondence to their upper portion, in order to protect the absorber element and the reflector element surfaces.

14. The device according to claim 1, wherein said reflector elements are symmetrically disposed in respect of the absorber element.

15. The device according to claim 1, wherein said reflector elements are asymmetrically disposed in respect of the absorber element.

16. A non-tracking solar collector panel, characterized in that it comprises a plurality of non-tracking solar collector device according to claim 1 arranged side by side to each other.

* * * * *